(12) United States Patent
Sakaguchi et al.

(10) Patent No.: US 8,541,964 B2
(45) Date of Patent: Sep. 24, 2013

(54) BRUSHLESS MOTOR ROTATION-POSITION DETECTION SYSTEM

(75) Inventors: Ryo Sakaguchi, Chiyoda-ku (JP); Makoto Itoi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 359 days.

(21) Appl. No.: 12/908,446

(22) Filed: Oct. 20, 2010

(65) Prior Publication Data

US 2011/0254479 A1  Oct. 20, 2011

(30) Foreign Application Priority Data

Apr. 14, 2010 (JP) ................................. 2010-093057

(51) Int. Cl.
*H02P 6/00* (2006.01)
(52) U.S. Cl.
USPC .................................. 318/400.01; 318/400.39
(58) Field of Classification Search
USPC .......................... 318/400.01, 400.39, 605, 661
See application file for complete search history.

(56) References Cited

U.S. PATENT DOCUMENTS

| | | | | |
|---|---|---|---|---|
| 6,525,502 B1 * | 2/2003 | Piedl et al. | ................ | 318/605 |
| 7,343,254 B2 * | 3/2008 | Otsuka et al. | ................ | 702/58 |
| 2007/0029955 A1 * | 2/2007 | Kanekawa et al. | ........... | 318/144 |
| 2008/0309527 A1 * | 12/2008 | Inoue | ............................ | 341/116 |
| 2009/0085508 A1 * | 4/2009 | Nagai et al. | ................... | 318/605 |

FOREIGN PATENT DOCUMENTS

| | | |
|---|---|---|
| JP | 02-284024 A | 11/1990 |
| JP | 04-038297 A | 2/1992 |
| JP | 10-243687 A | 9/1998 |
| JP | 2000-039337 A | 2/2000 |
| JP | 2002-054951 A | 2/2002 |
| JP | 2002-196025 A | 7/2002 |
| JP | 2004-045286 A | 2/2004 |
| JP | 2005-210839 A | 8/2005 |
| JP | 2005-257565 A | 9/2005 |

OTHER PUBLICATIONS

Japanese Office Action dated Mar. 12, 2012 in corresponding Japanese Patent Application No. 20010-093057.

* cited by examiner

*Primary Examiner* — Rina Duda

(74) *Attorney, Agent, or Firm* — Sughrue Mion, PLLC

(57) ABSTRACT

A rotation-position detection system according to the present invention is configured with a resolver mounted in a brushless motor and a motor controller. The motor controller outputs an excitation signal to the resolver and an A/D converter thereof alternately applies analogue/digital conversion to a sine wave signal and a cosine wave signal outputted from the resolver so that a rotation position of the motor is calculated.

14 Claims, 13 Drawing Sheets

BRUSHLESS MOTOR ROTATION-POSITION DETECTION SYSTEM

BACKGROUND OF THE INVENTION

1. Field of the Invention

The present invention relates to a rotation-position detection system for a brushless motor in which a resolver is mounted.

2. Description of the Related Art

In the case of a control system for controlling a brushless motor, in order to optimally control the brushless motor, there is required a means for detecting the rotation position of the brushless motor. As means for detecting the rotation position of a brushless motor, a hole IC, a resolver, and the like are commonly known. Because it can more accurately detect the rotation position of a brushless motor than a hole IC, the resolver is suitable for a system for suppressing torque fluctuation while the motor rotates or a system that performs servo control.

With regard to a method of detecting the rotation position of a brushless motor by use of a resolver, Japanese Patent Application Laid-Open No. 2005-210839 discloses a method utilizing a dedicated resolver/digital conversion IC and a method utilizing a microcomputer. FIG. 12 represents a timing chart, described in Japanese Patent Application Laid-Open No. 2005-210839, at a time when the rotation position of a brushless motor is detected. In a method disclosed in Japanese Patent Application Laid-Open No. 2005-210839, a microcomputer supplies an excitation signal to a resolver; the microcomputer applies an analogue/digital conversion (referred to also as an A/D conversion, hereinafter) concurrently to a sine wave signal and a cosine wave signal that are outputted by the resolver, due to the supply of the excitation signal to the resolver; from the respective maximum values and minimum values of the foregoing signals, a sine wave signal amplitude V sin and a cosine wave signal amplitude V cos of the resolver are obtained; then, a pivoting angle θ of the resolver rotation axle is given by Equations (1) and (2) below.

$$\tan\theta = (V\sin)/(V\cos) \quad (1)$$

$$\theta = \arctan(V\sin/V\cos) \quad (2)$$

As an example of application of a method utilizing a brushless motor, there is known a system, as an electric power steering apparatus for an automobile, that controls the torque of a motor so as to assist the steering torque, as described in Japanese Patent No. 3427876. In addition, there is known a system, as the steering apparatus of a boat, that rotates an outboard engine mounted on a boat, as described in Japanese Patent No. 2959044.

In the conventional rotation-position detection system disclosed in Japanese Patent Application Laid-Open No. 2005-210839, for the purpose of accurately detecting the rotation position of a motor, it is required to apply the A/D conversion to the sine wave signal and the cosine wave signal outputted by the resolver at a single and the same timing; therefore, there is required a rotation-position detection system in which two or more analogue/digital converters (referred to also as A/D converters, hereinafter) are mounted. Alternatively, in the case where only a single A/D converter is mounted in the rotation-position detection system, it is required to provide a sample/hold circuit in an external peripheral circuit or the microcomputer, to apply sampling to the sine wave signal and the cosine wave signal at a single and the same timing, and then to apply the A/D conversion to the sampled signals. As described above, for the purpose of accurately detecting the rotation position of a brushless motor, it is required to mount a plurality of A/D converters or a sample/hold circuit on the rotation-position detection system; thus, there has been a problem that the system is expensive.

As described in Japanese Patent Application Laid-Open No. 2005-210839, it is generally required to perform processing of detecting the rotation position of a motor in a shorter control period than to perform control of the motor; in addition, in the case of the system described in Japanese Patent No. 3427876 or Japanese Patent No. 2959044, the control period for a brushless motor is fast (e.g., processed every 100 µs or 500 µs), in most cases. Accordingly, for the purpose of performing processing of detecting the rotation position of a brushless motor and processing of controlling the brushless motor, a high-performance (calculation processing is performed fast) microcomputer is required.

In the case of an electric power steering apparatus described in Japanese Patent No. 3427876, the torque assisted by a brushless motor is directly transferred to a steerer; therefore, it is required to accurately detect the rotation position of the brushless motor so as to control the torque. However, in the case of the steering system described in Japanese Patent No. 2959044, because the transfer mechanism for rotating an outboard engine and the steering system are mechanically separated, the torque of a brushless motor is not sensed by a steerer; thus, the rotation position of a brushless motor is not required to be as accurate as that of Japanese Patent No. 3427876.

SUMMARY OF THE INVENTION

The present invention has been implemented in order to solve the foregoing conventional problems from above point of view; the objective thereof is to provide a brushless motor rotation-position detection system in which only a single A/D converter is mounted, in which no sample/hold circuit is provided in a microcomputer or an external peripheral circuit thereof, and that can accurately detect the rotation position of a brushless motor although simply and inexpensively configured.

A brushless motor rotation-position detection system according to the present invention is provided with a resolver mounted in a brushless motor; a motor controller for driving the brushless motor; and a calculation means (microcomputer) that performs calculation for controlling the motor, based on rotation-position information on the brushless motor. In the brushless motor rotation-position detection system, the calculation means includes an excitation signal supply means that supplies an excitation signal to the resolver; an analogue/digital converter that applies analogue/digital conversion to a sine wave signal and a cosine wave signal outputted from the resolver; a resolver amplitude calculation means that calculates a sine wave amplitude and a cosine wave amplitude, based on the sine wave signal and the cosine wave signal obtained through the analogue/digital conversion by the analogue/digital converter; and a motor angle calculation means that calculates a motor rotation angle of the brushless motor, based on the sine wave amplitude and the cosine wave amplitude calculated by the resolver amplitude calculation means, and the analogue/digital converter alternately applies analogue/digital conversion to a sine wave signal and a cosine wave signal that are outputted from the resolver after an excitation signal is supplied to the resolver.

The alternate analogue/digital conversion denotes analogue/digital conversion applied to a sine wave signal, the sine wave signal, a cosine wave signal, and the cosine wave signal in that order, or analogue/digital conversion applied to a sine wave signal, a cosine wave signal, the sine wave signal, and the cosine wave signal in that order.

In the brushless motor rotation-position detection system according to the present invention, the microcomputer thereof is provided with only a single A/D converter, and the rotation position of the brushless motor can accurately be detected through a simple and inexpensive configuration, even when no sample/hold circuit is provided.

The foregoing and other object, features, aspects, and advantages of the present invention will become more apparent from the following detailed description of the present invention when taken in conjunction with the accompanying drawings.

DETAILED DESCRIPTION OF THE PREFERRED EMBODIMENTS

Figure 1:
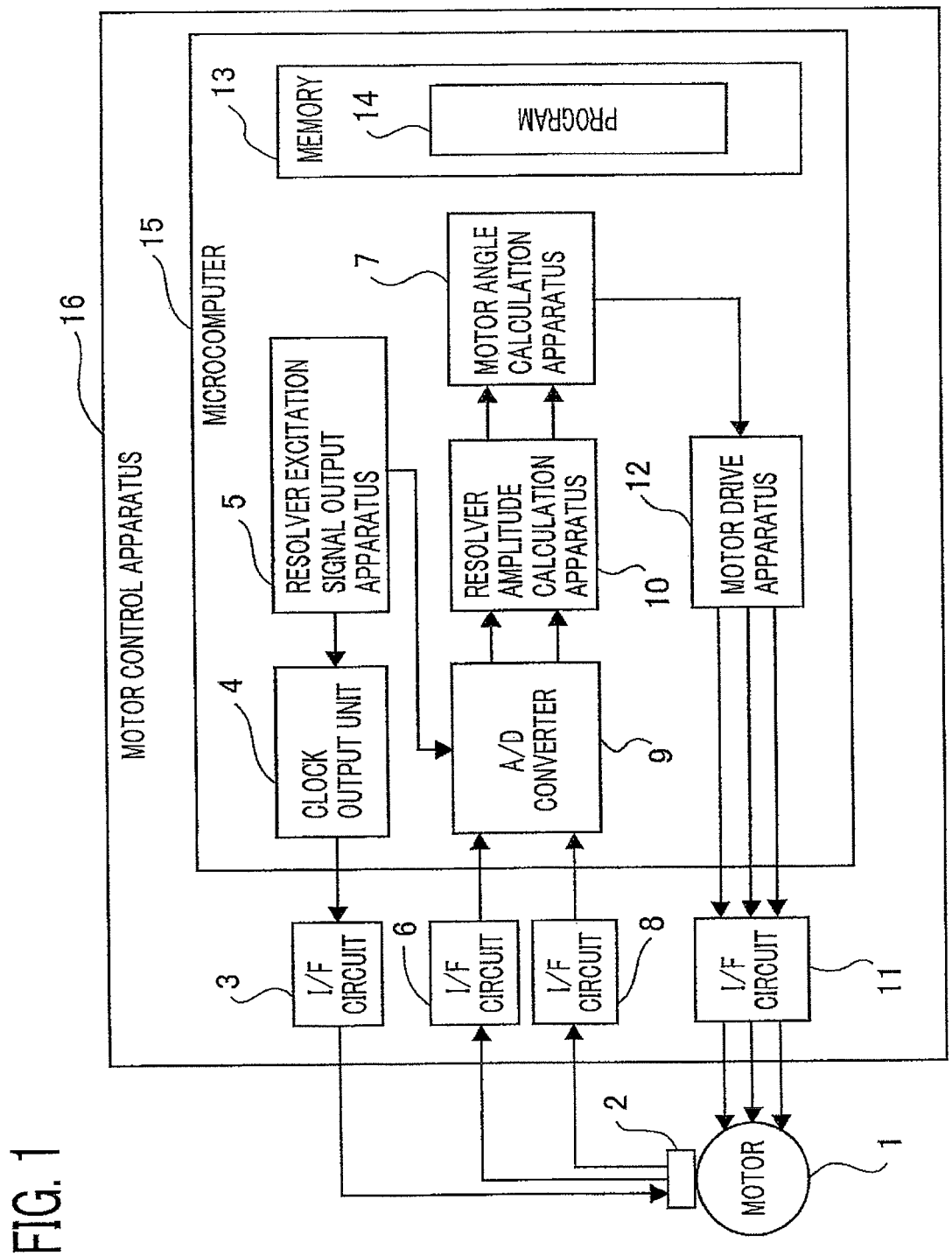
FIG. 1 is a system configuration diagram of a brushless motor rotation-position detection system according to Embodiment 1 of the present invention.

Hereinafter, embodiments of the present invention will be explained with reference to the drawings. In each of the drawings, the same reference characters denote the same or similar portions.

Embodiment 1

FIG. 1 is a system configuration diagram of a brushless motor rotation-position detection system according to Embodiment 1 of the present invention. In FIG. 1, a brushless motor rotation-position detection system according to Embodiment 1 is provided with a motor controller 16 for driving a brushless motor 1 and a resolver 2 for detecting the motor position of the brushless motor 1, which is a control subject. The motor controller 16 is provided with an interface circuit 3 (referred to only as an I/F circuit, hereinafter) for exciting the resolver 2, an I/F circuit 6 for receiving a sine wave signal outputted by the resolver 2, an I/F circuit 8 for receiving a cosine wave signal outputted by the resolver 2, an I/F circuit 11 for driving the brushless motor 1, and a microcomputer (referred to also as a calculation means, hereinafter) 15 that performs calculation for controlling the motor, based on rotation-position information on the brushless motor 1.

The microcomputer 15 is provided with a resolver excitation signal output device 5 that outputs a signal for exciting the resolver 2; a clock output unit 4 that outputs the signal from the resolver excitation signal output device 5 to the I/F circuit 3 for exciting the resolver 2; an A/D converter 9 for applying A/D conversion to a sine wave signal and a cosine wave signal outputted by the resolver 2; a resolver amplitude calculation device 10 that calculates the amplitudes of the sine wave signal and the cosine wave signal, based on a value outputted from the A/D converter 9; a motor angle calculation apparatus 7 that calculates the angle of the motor, based on the amplitudes of the sine wave signal and the cosine wave signal; a motor drive apparatus 12 that generates a motor drive signal in accordance with the angle of the motor; and a memory 13 and a program 14 for controlling the operation of each of the motor controller 16 and the microcomputer 15.

In the brushless motor rotation-position detection system, configured as described above, according to Embodiment 1, the excitation signal for the resolver 2 is generated by the resolver excitation signal output device 5. In general, the excitation frequency for the resolver 2 is set to be the same as or higher than the control frequency for a motor; for example, the resolver is excited at 10 kHz. The resolver excitation signal output device 5 outputs a rectangular wave (a clock signal) having a frequency set through the clock output unit 4. The rectangular wave outputted from the clock output unit 4 is converted by the I/F circuit 3 in the motor controller 16 into a pseudo-sine wave (an excitation signal) of an amplitude Vr, as expressed by Equation (3) below, and then excites the resolver 2.

$$f1(t) = Vr \cdot \sin(\omega t) \tag{3}$$

Based on Equations (4) and (5) below, the resolver 2 outputs a sine wave signal and a cosine wave signal in accordance with the excitation signal and the position θ of the brushless motor 1. Here, α denotes a phase shift of an output voltage.

$$V\sin = Vr \cdot \sin(\omega t + \alpha) \cdot Vs \cdot \sin(\theta) \tag{4}$$

$$V\cos = Vr \cdot \sin(\omega t + \alpha) \cdot Vc \cdot \cos(\theta) \tag{5}$$

Figure 2:
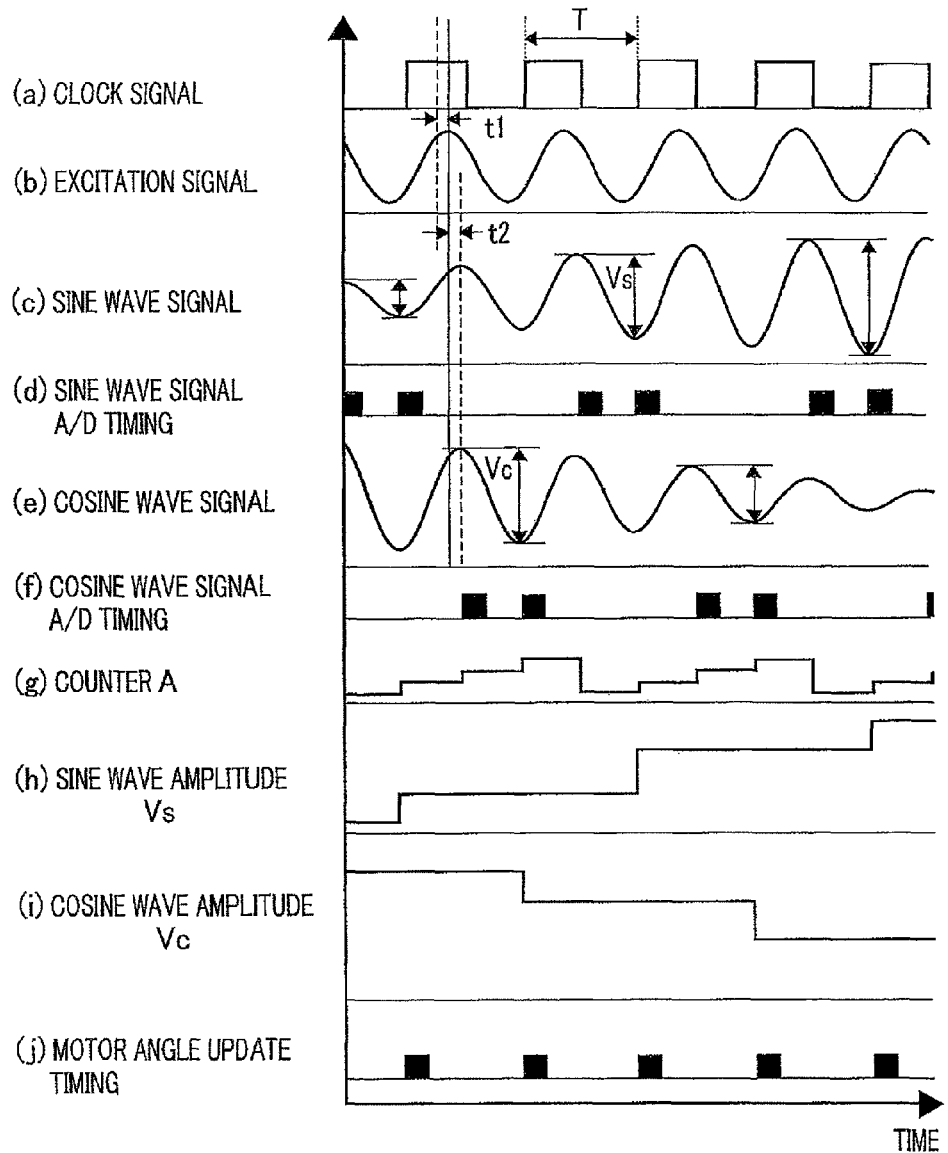
FIG. 2 is a timing chart for explaining control according to Embodiment 1 of the present invention.

The sine wave signal and the cosine wave signal outputted from the resolver 2 pass through the I/F circuits 6 and 8, respectively, and are inputted to the A/D converter 9. Because only a single A/D converter 9 is provided in the microcomputer 15, the sine wave signal and the cosine wave signal are alternately converted, as represented in (d) and (F) of FIG. 2. The timings for the A/D conversions are preliminarily stored in the microcomputer 15; the A/D conversion is called up approximately at a timing when the sine wave signal or the cosine wave signal outputted from the resolver 2 becomes the maximum or minimum value.

Figure 3:
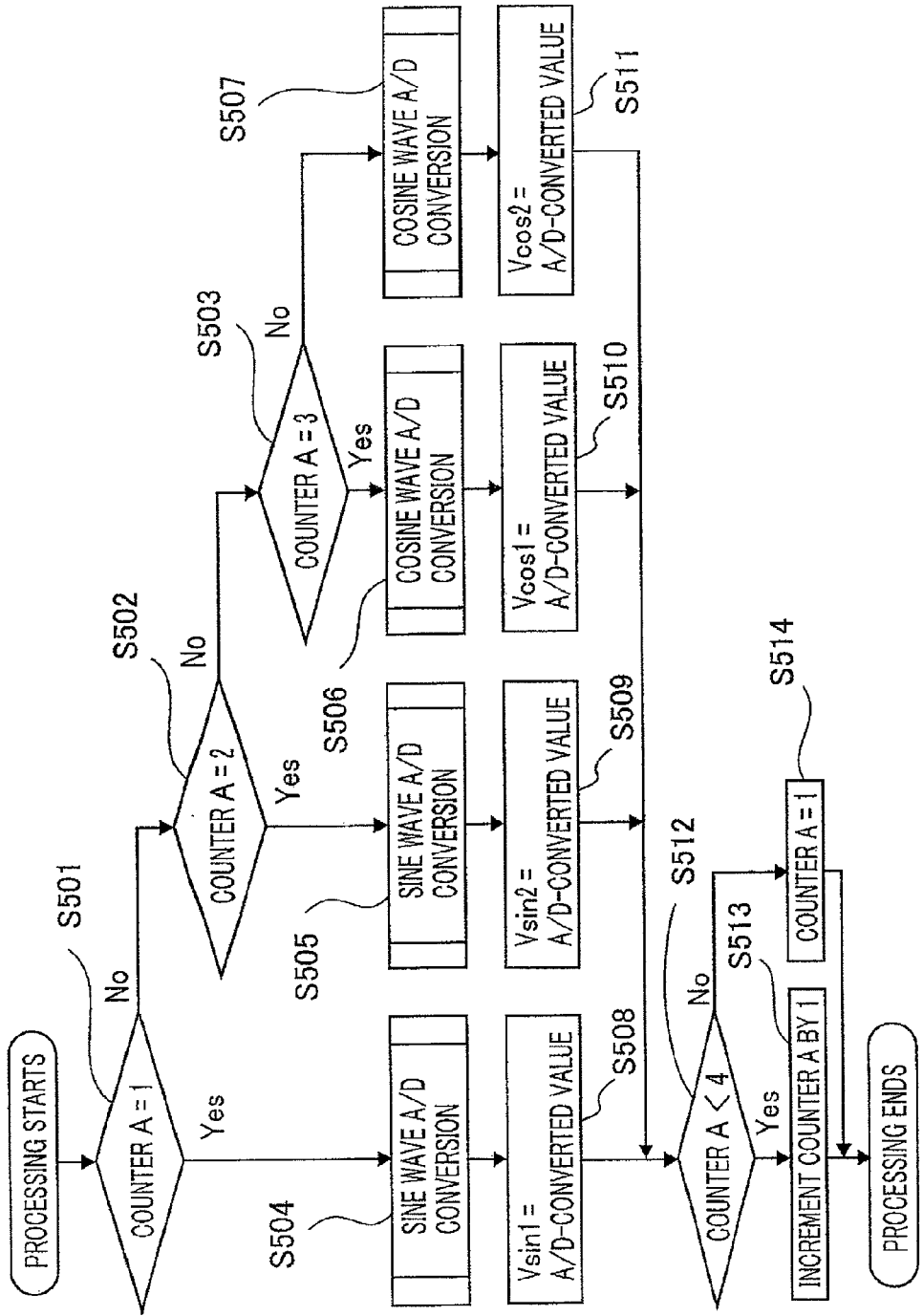
FIG. 3 is a flowchart for explaining control according to Embodiment 1 of the present invention.
Figure 4:
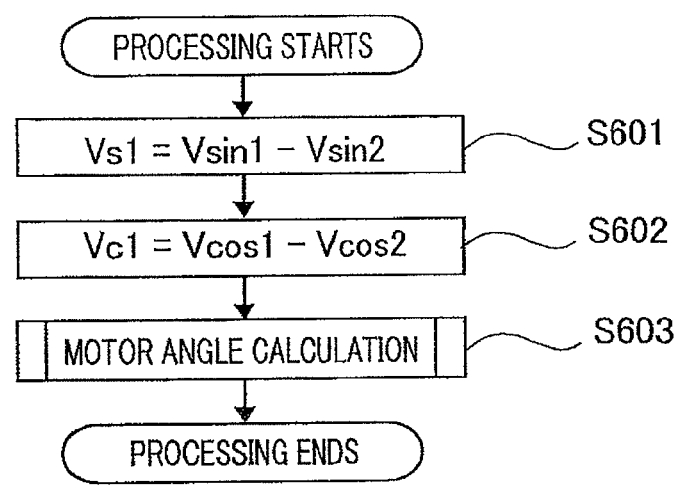
FIG. 4 is a flowchart for explaining control according to Embodiment 1 of the present invention.
Figure 5:
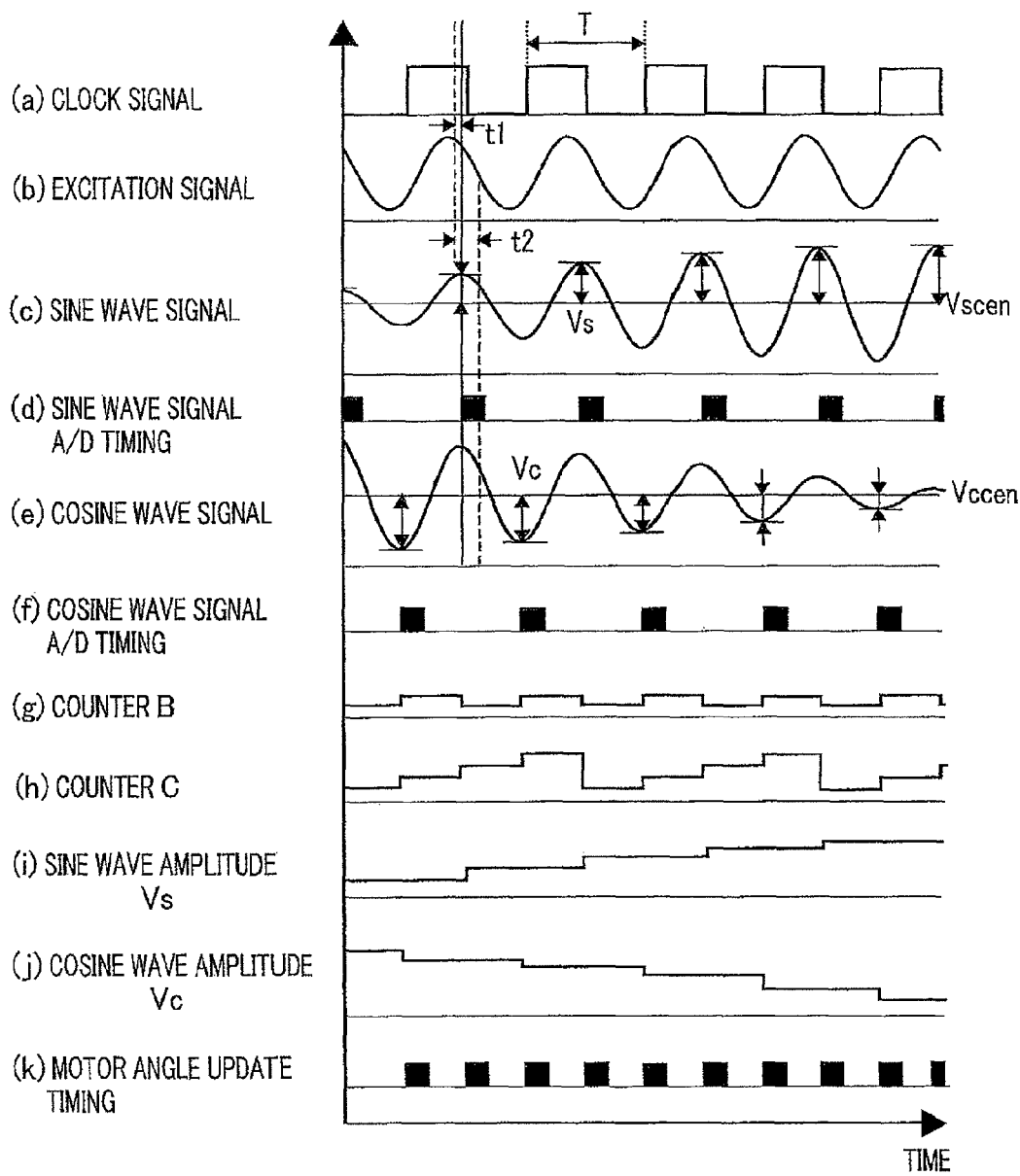
FIG. 5 is a timing chart of control in a brushless motor rotation-position detection system according to Embodiment 2 or 3 of the present invention.

Next, with reference to FIGS. 3 and 4, there will be explained the operation in which the motor angle is calculated from the sine wave signal and the cosine wave signal. At first, in a time (e.g., 50 μs) that is half of the excitation period T for the resolver 2, the processing represented in FIG. 3 is called up. In the processing represented in FIG. 3, it is determined in the steps S501 through S503 which number out of 1 through 4 the value of a counter A in the microcomputer is. In the case where the value of the counter A is "1", the step S501 is followed by the step S504; in the case where the value of the counter A is "2", the step S502 is followed by the step S505; in the case where the value of the counter A is "3", the step S503 is followed by the step S506; in the case where the value of the counter A is none of "1" through "3" (i.e., in the case where the value of the counter A is "4"), the step S503 is followed by the step S507. In each of the steps S504 through S507, A/D conversion is performed. The subjects of the A/D conversion are switched in accordance with the value of the counter A, described above. In the case where the value of the counter A is "1" or "2", the A/D conversion is applied to the terminal to which the sine wave signal is inputted; in the case where the value of the counter A is "3" or "4", the A/D conversion is applied to the terminal to which the cosine wave signal is inputted. In the steps S508 through S511, values obtained by performing the A/D conversions in the steps S504 through S507 are stored in a memory, as V sin 1, V sin 2, V cos 1, and V cos 2, respectively. After that, in the steps S512 through S514, addition and clipping processing are performed in such a way that the value of the counter A is repeated within a range from "1" to "4".

Next, there will be explained processing, represented in FIG. 4, for calculating the motor angle. At first, in the step S601, the amplitude Vs1 of the sine wave is obtained from the sine wave signals V sin 1 and V sin 2 stored in the processing represented in FIG. 3. Next, in the step S602, as is the case with the step S601, the amplitude Vc1 of the cosine wave is obtained from V cos 1 and V cos 2. In the step S603, the motor angle is calculated by utilizing Vs1 and Vc1 obtained in the steps S601 and S602 and Equations (1) and (2), described above.

As described above, in the brushless motor rotation-position detection system according to Embodiment 1 of the present invention, even though the update period for each of the sine wave amplitude Vs1 and the cosine wave amplitude Vc1 is 2T that is twice as long as that in the conventional system, the combination of the sine wave amplitude and the cosine wave amplitude is updated in the period T, as is the case with the conventional system. Accordingly, the rotation position of the motor can be detected in the same control period as the conventional system; therefore, not only the microcomputer in the rotation-position detection system is not provided with two or more A/D converters, but also the rotation position of the brushless motor can accurately be detected through a simple and inexpensive configuration, even when no sample/hold circuit is provided.

Embodiment 2

Next, there will be explained Embodiment 2 of the present invention with reference to FIGS. 5 through 8. The configuration diagram of the system according to Embodiment 2 is the same as that of the system according to Embodiment 1.

Figure 6:
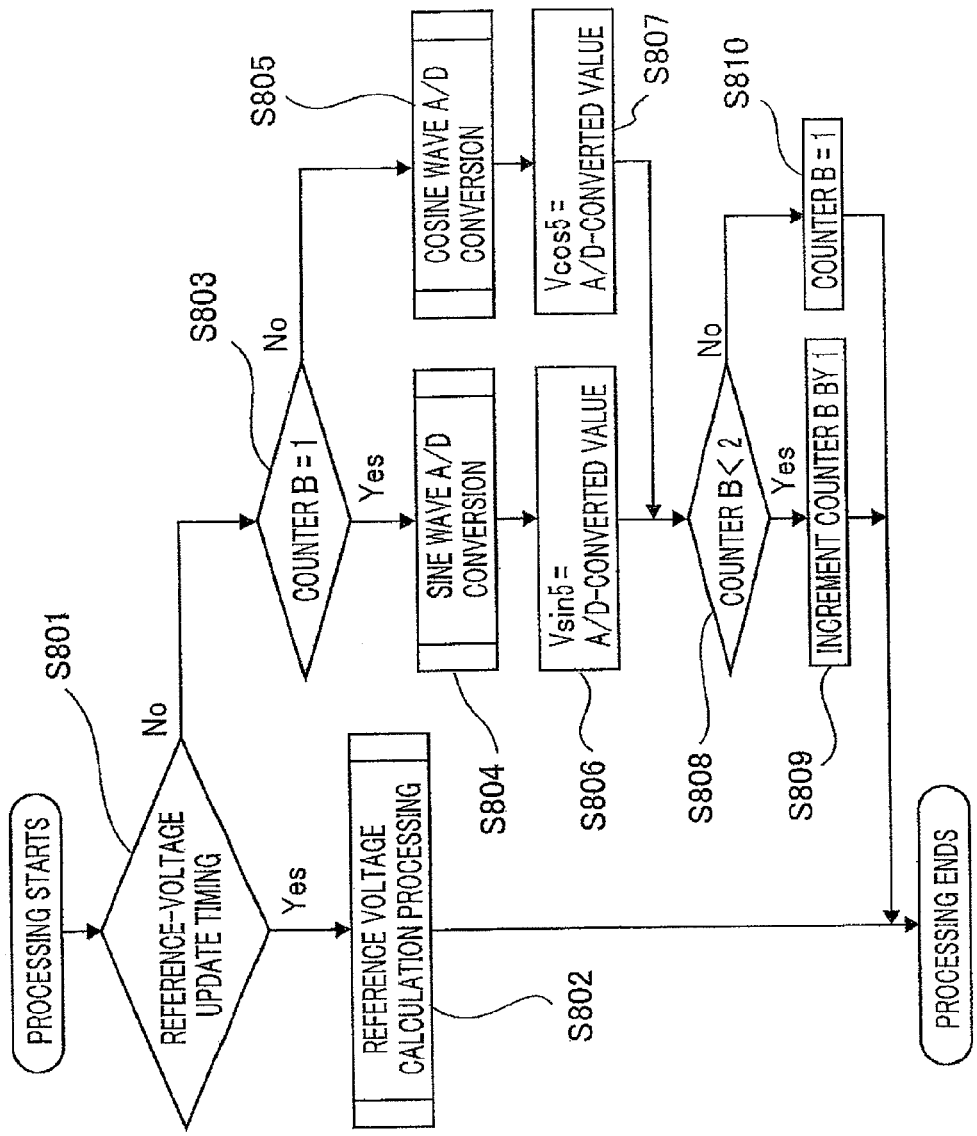
FIG. 6 is a flowchart for explaining control according to Embodiment 2 of the present invention.

At first, in a time that is half of the excitation period T for the resolver, the processing represented in FIG. 6 is called up. In FIG. 6, it is determined in the step S801 whether or not the present timing is a reference-voltage learning timing. In Embodiment 2, unlike Embodiment 1, each of the sine wave signal and the cosine wave signal is A/D-converted only at one side timing (only when the excitation signal is the maximum value or the minimum value), as represented in (d) and (f) of FIG. 5. Accordingly, for the purpose of obtaining the sine wave amplitude and the cosine wave amplitude, it is required that the calculations expressed by Equations (6) and (7) are performed by utilizing the respective A/D-converted values and a reference voltage. However, due to variations in the components of the I/F circuit or other factors, the reference voltage may not be exactly the same as a theoretical value; thus, it is required that the learning operation is performed. The reference-voltage learning is performed, for example, every specific time, immediately after the activation of the motor controller or while the motor is stopped.

$$Vs = (V\sin - Vscen) \times 2 \qquad (6)$$

$$Vc = (V\cos - Vccen) \times 2 \qquad (7)$$

In the step S801, in the case where the present timing is the reference-voltage learning timing, the step S801 is followed by the step S802; in other cases, the step S801 is followed by the step S803.

Figure 7:
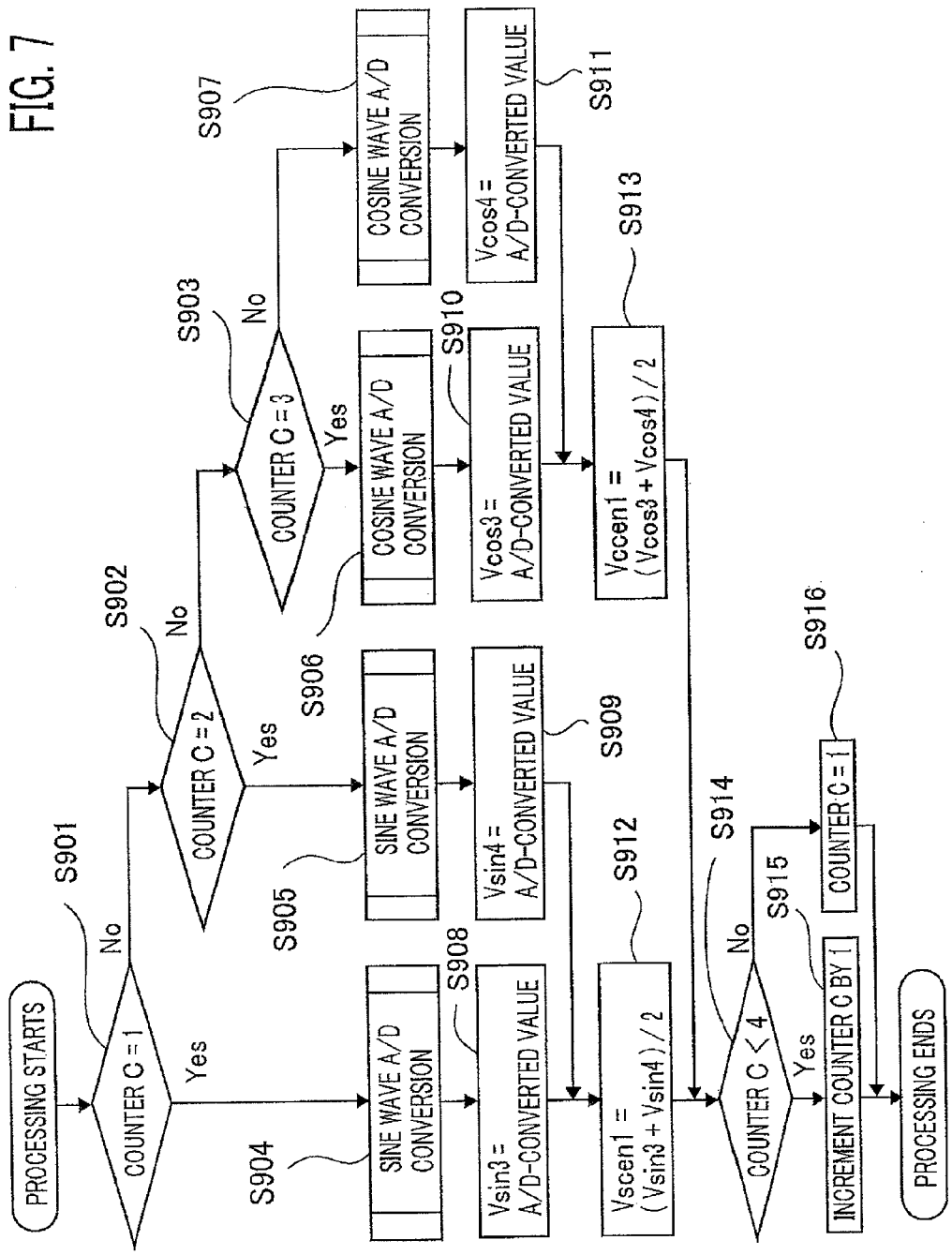
FIG. 7 is a flowchart for explaining control according to Embodiment 2 of the present invention.

The detail of the processing in the step S802 will be explained with reference to FIG. 7. At first, in the steps S901 through S903, it is determined which number out of 1 through 4 the value of a counter C in the microcomputer is. In the case where the value of the counter C is "1", the step S901 is followed by the step S904; in the case where the value of the counter C is "2", the step S902 is followed by the step S905; in the case where the value of the counter C is "3", the step S903 is followed by the step S906; in the case where the value of the counter C is none of "1" through "3" (i.e., in the case where the value of the counter C is "4"), the step S903 is followed by the step S907.

Next, in each of the steps S904 through S907, A/D conversion is performed. The subjects of the A/D conversion are switched in accordance with the value of the counter C, described above. In the case where the value of the counter C is "1" or "2", the A/D conversion is applied to the terminal to which the sine wave signal is inputted; in the case where the value of the counter C is "3" or "4", the A/D conversion is applied to the terminal to which the cosine wave signal is inputted. In the steps S908 through S911, values obtained by performing the A/D conversions in the steps S904 through S907 are stored in a memory, as V sin 3, V sin 4, V cos 3, and V cos 4, respectively. After that, in the steps S912 and S913, a reference voltage Vscen1 of the sine wave signal and a reference voltage Vccen1 of the cosine wave signal are obtained and stored as learning values. The reference voltage Vscen1 is obtained as the average value of V sin 3 and V sin 4 stored in the steps S908 and S909; the reference voltage Vccen1 is obtained as the average value of V cos 3 and V cos 4 stored in the steps S910 and S911. At last, in the steps S914 through S916, addition and clipping processing are performed in such a way that the value of the counter C is repeated within a range from "1" to "4".

Next, there will be explained processing that is performed in the case where it is determined that the present timing is not the reference-voltage learning timing. At first, it is determined in the step S803 whether or not the value of the counter B is "1". In the case where the value of the counter B is "1", the step S803 is followed by the step S804; in the case where the value of the counter B is not "1", the step S803 is followed by the step S805.

In each of the steps S804 and S805, A/D conversion is performed. The subjects of the A/D conversion are switched in accordance with the value of the counter B, described above. In the case where the value of the counter B is "1", the A/D conversion is applied to the terminal to which the sine wave signal is inputted; in the case where the value of the counter B is "2", the A/D conversion is applied to the terminal to which the cosine wave signal is inputted. In the steps S808 and S807, values obtained by performing the A/D conversions in the steps S804 and S805 are stored in a memory, as V sin 5 and V cos 5, respectively. At last, in the steps S808 through S810, addition and clipping processing are performed in such a way that the value of the counter B is repeated within a range from "1" to "2".

Next, there will be explained processing, represented in FIG. 8, for calculating the motor angle. At first, in the step S1001, a sine wave amplitude Vs2 is obtained by performing a calculation expressed by Equation (6), based on the sine wave reference signal Vscen1 stored in the process represented in FIG. 7 and the sine wave signal V sin 5 stored in the process represented in FIG. 6. Next, in the step S1002, as is the case with the step S1001, a cosine wave amplitude Vc2 is obtained by performing a calculation expressed by Equation (7), based on Vccen1 and V cos 5. In the step S1003, as is the case with Embodiment 1, the motor angle is obtained by utilizing Vs2 and Vc2 obtained in the steps S1001 and S1002, respectively.

As described above, in the brushless motor rotation-position detection system according to Embodiment 2, the sine wave amplitude Vs2 and the cosine wave amplitude Vc2 can be updated in the update period T, as is the case with a conventional system. Furthermore, the combination of the sine wave amplitude and the cosine wave amplitude is updated in the period T/2 that is shorter than the conventional update period. Moreover, even in the case where, due to variations in the components in the I/F circuit or the like, the reference voltage of the sine wave signal or the cosine wave signal outputted from the resolver deviates, the deviation can be corrected through the processing represented in FIG. 7. Still moreover, when the reference voltage does not fall within the theoretical range, it can be determined that the I/F circuit that receives the output of the resolver is defective, by performing the processing represented in FIG. 7.

Embodiment 3

Figure 9:
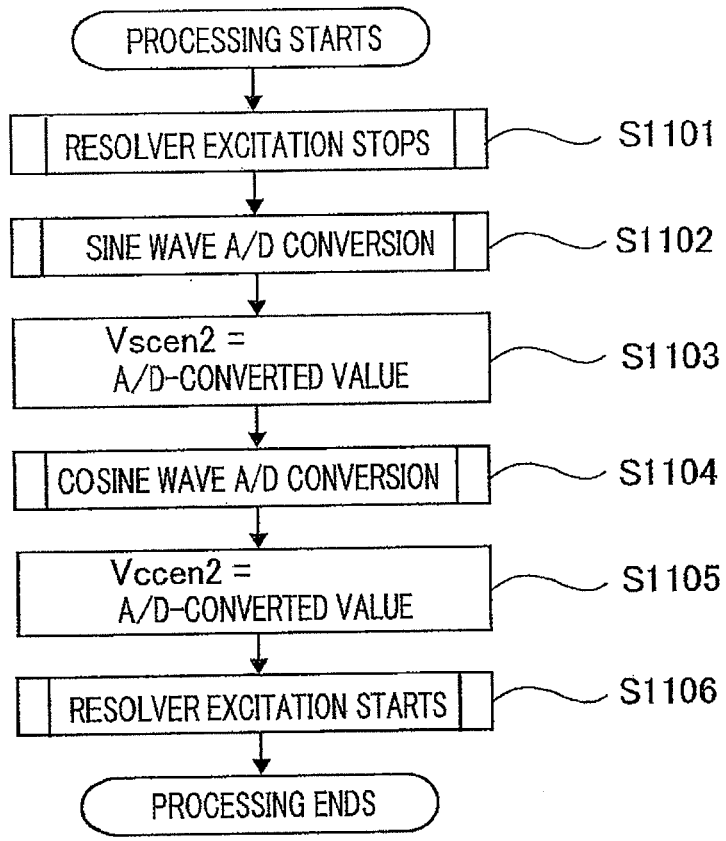
FIG. 9 is a flowchart of control in a brushless motor rotation-position detection system according to Embodiment 3 of the present invention.

Next, there will be explained Embodiment 3 of the present invention with reference to FIG. 9. Embodiment 3 differs from Embodiment 2 in terms of reference-voltage learning processing; however, because the other processing is similar to that in Embodiment 2, only the reference-voltage learning processing will be explained.

At first, as is the case with Embodiment 2, in the case where it is determined in the step S801 that the present timing is the reference-voltage learning timing, the step S801 is followed by the step S1101. In the step S1101, excitation of the resolver is interrupted. When the excitation of the resolver is interrupted, each of the sine wave signal and the cosine wave signal becomes equal to the reference voltage. Accordingly, in the step S1102, A/D conversion is applied to the terminal to which the sine wave signal is inputted, and in the step S1103, the value obtained through the conversion is stored in a memory, as a sine wave reference voltage Vscen2. In the step S1104, A/D conversion is applied to the terminal to which the cosine wave signal is inputted, and in the step S1105, the value obtained through the conversion is stored in a memory, as a cosine wave reference voltage Vccen2. At last, excitation of the resolver is resumed in the step S1106.

Figure 8:
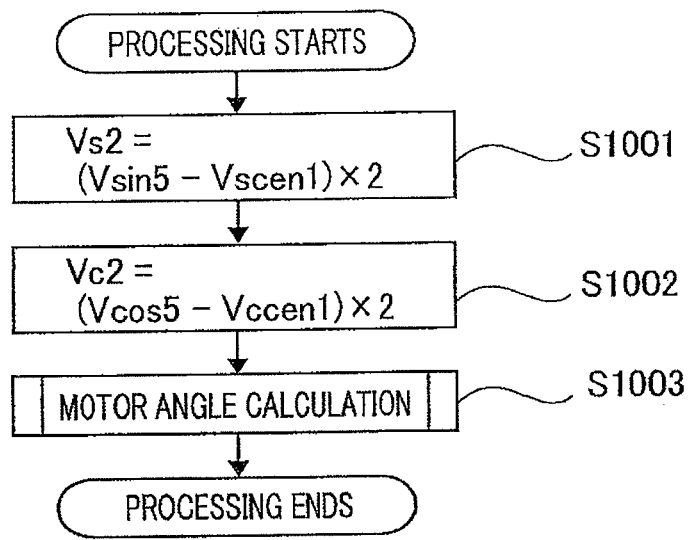
FIG. 8 is a flowchart for explaining control according to Embodiment 2 of the present invention.

In the case where the present timing is not the reference-voltage learning timing, A/D conversion is performed in the processing represented in FIG. 6 and the motor angle is calculated in the processing represented in FIG. 8, as is the case with Embodiment 2.

According to Embodiment 3, the reference voltage is obtained by interrupting excitation of the resolver; therefore, the reference voltage cannot be learned while the motor is driven. Accordingly, the reference voltage needs to be learned immediately after the activation of the motor controller or while the motor is stopped. However, unlike Embodiment 2, it is not required that, when the reference voltage is learned, the A/D conversion is performed four times; thus, the reference voltage can be learned in a shorter time.

Embodiment 4

Figure 10:
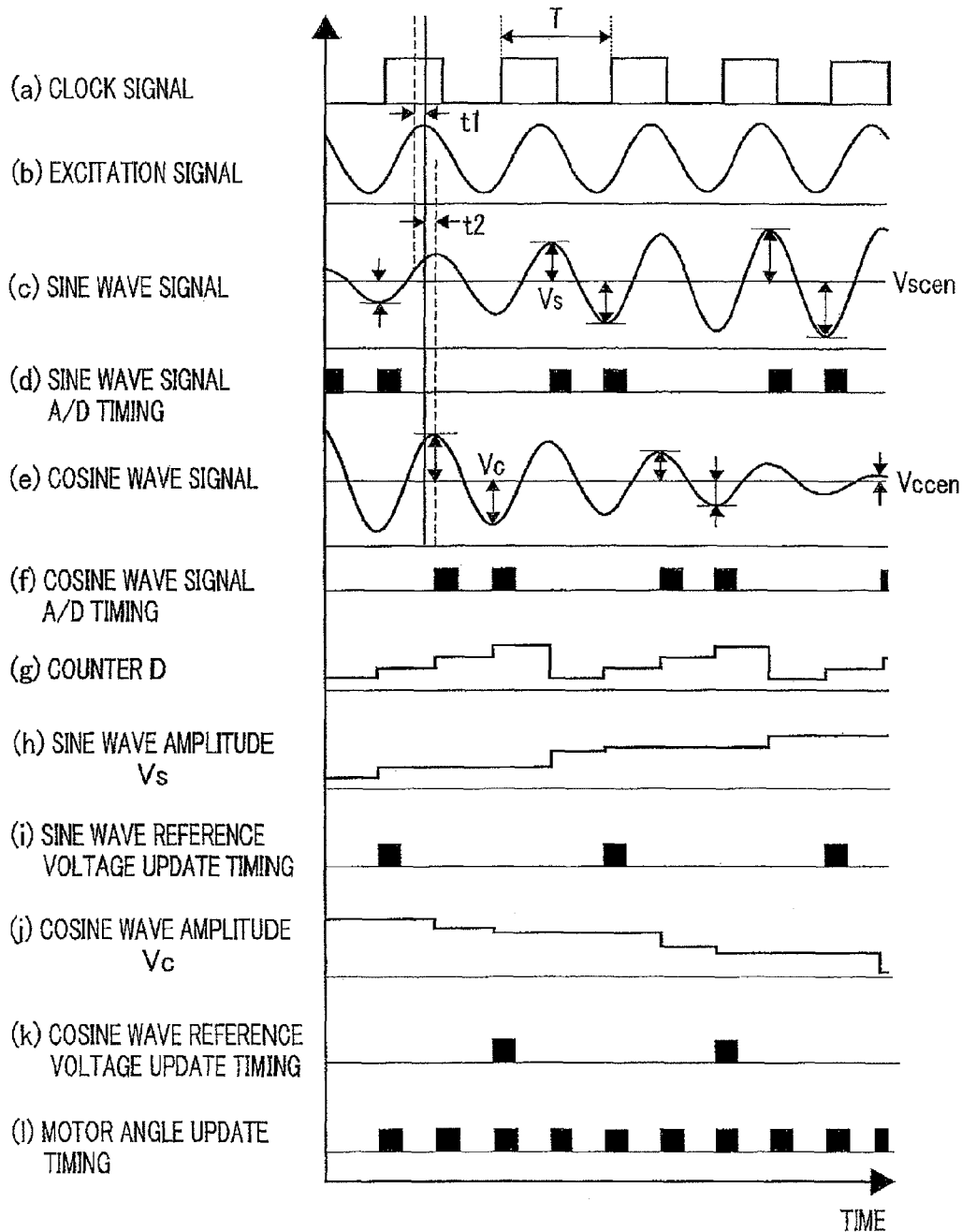
FIG. 10 is a timing chart for explaining control according to Embodiment 4 of the present invention.

Next, there will be explained Embodiment 4 with reference to FIGS. 10 through 11. The configuration diagram of the system according to Embodiment 4 is the same as that of the system according to Embodiment 1.

Figure 11A:
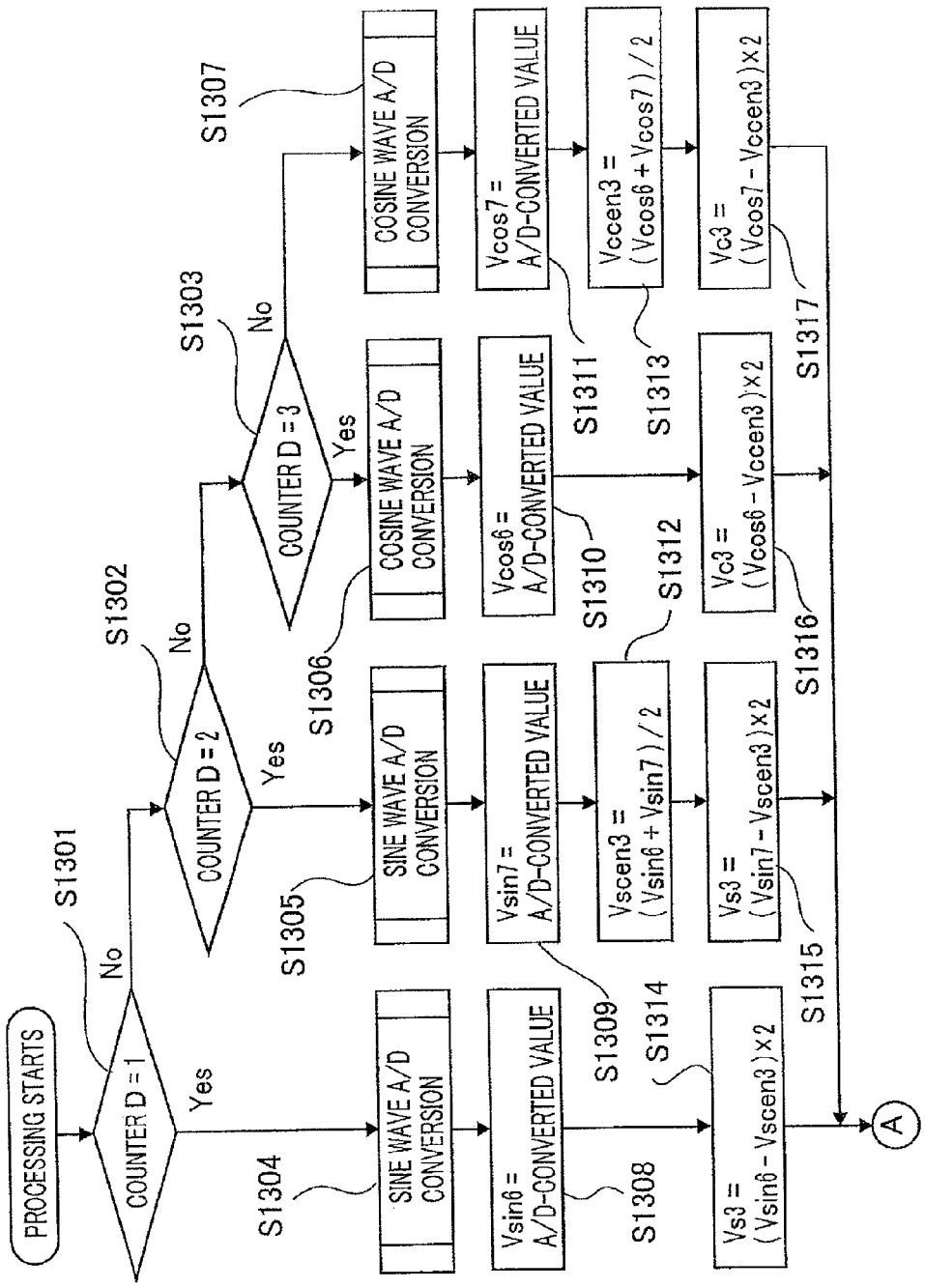
FIGS. 11A and 11B are a set of flowcharts for explaining control according to Embodiment 4 of the present invention.
Figure 11B:
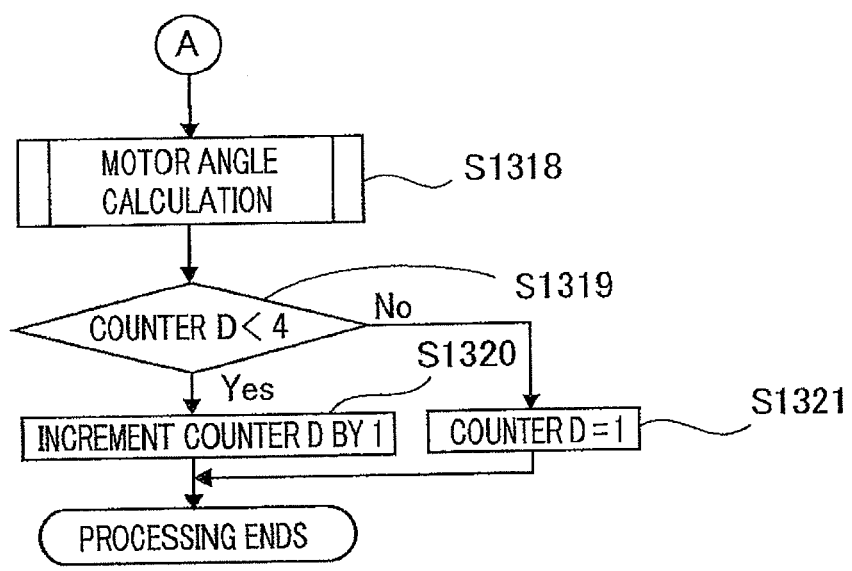
Figure 12:
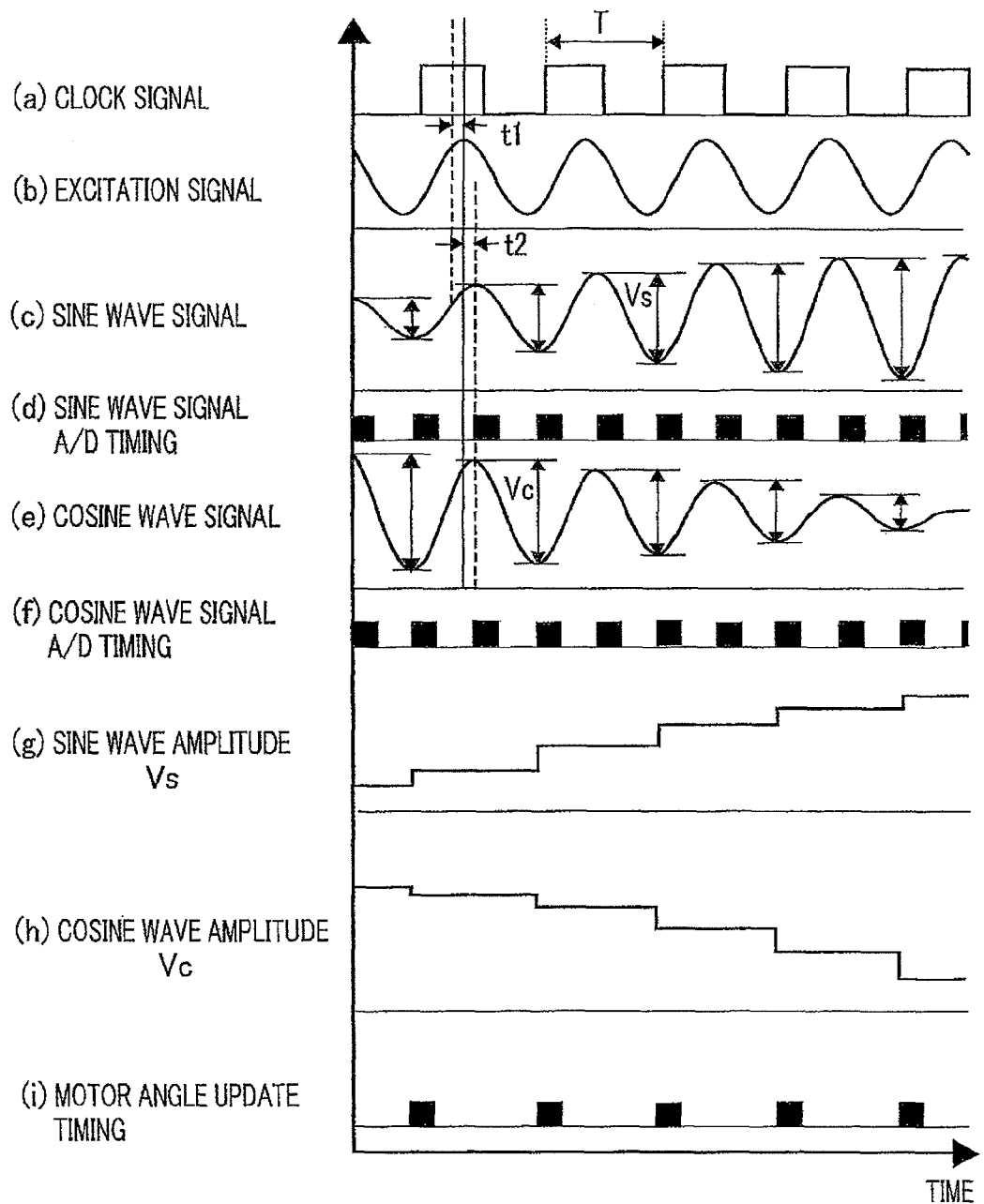
FIG. 12 is a timing chart for explaining control in a conventional brushless motor rotation-position detection system.

At first, in a time that is half of the excitation period T for the resolver, the processing represented in FIGS. 11A and 11B is called up. In the steps S1301 through S1303, it is determined which number out of 1 through 4 the value of a counter D in the microcomputer is. In the case where the value of the counter D is "1", the step S1301 is followed by the step S1304; in the case where the value of the counter D is "2", the step S1302 is followed by the step S1305; in the case where the value of the counter D is "3", the step S1303 is followed by the step S1306; in the case where the value of the counter D is none of "1" through "3" (i.e., in the case where the value of the counter D is "4"), the step S1303 is followed by the step S1307. In each of the steps S1304 through S1307, A/D conversion is performed. The subjects of the A/D conversion are switched in accordance with the value of the counter D, described above. In the case where the value of the counter D is "1" or "2", the A/D conversion is applied to the terminal to which the sine wave signal is inputted; in the case where the value of the counter D is "3" or "4", the A/D conversion is applied to the terminal to which the cosine wave signal is inputted. In the steps S1308 through S1311, values obtained by performing the A/D conversions in the steps S1304 through S1307 are stored in a memory, as V sin 6, V sin 7, V cos 6, and V cos 7, respectively.

Next, in the case where the value of the counter D is "2", processing represented in the step S1312 is performed; in the case where the value of the counter D is "4", processing represented in the step S1313 is performed. In the step S1312, a sine wave reference voltage Vscen3 is obtained by utilizing V sin 6 and V sin 7. In the step 1313, as is the case with the step S1312, a cosine wave reference voltage Vccen3 is obtained. The reason why each of the reference voltages is obtained only when the value of the counter D is "2" or "4" is that a value obtained by performing the A/D conversion at as close a timing as possible is utilized.

Next, in the steps S1314 through S1317, a sine wave amplitude Vs3 and a cosine wave amplitude Vc3 are obtained by utilizing the reference voltages obtained in the steps S1312 and S1313. Next, in the step S1318, through the same method as that in Embodiment 1, the motor angle is obtained by utilizing Vs3 and Vc3 obtained in the steps S1314 through S1317. At last, in the steps S1319 through S1321, addition and clipping processing are performed in such a way that the value of the counter D is repeated within a range from "1" to "4".

In the brushless motor rotation-position detection system according to Embodiment 4 of the present invention, as is the case with Embodiment 3, the sine wave amplitude Vs3 and the cosine wave amplitude Vc3 can be updated in the period T (average). Furthermore, the combination of the sine wave amplitude and the cosine wave amplitude is updated in the period T/2 that is shorter than the conventional update period; therefore, the motor angle can be updated in a period shorter than that in a conventional system.

In addition, in the case where the reception circuit for the resolver fails, the reference voltages are erroneously calculated in the steps S1312 and S1314, and in the following steps, calculations are performed based on the erroneous values;

therefore, to the calculation processing items for Vscen3 and Vccen3, there may be added processing items in which variation amounts from Vscen3 and Vccen3 obtained in the previous period are clipped.

Moreover, in Embodiment 4, the sine wave reference voltage and the cosine wave reference voltage are updated in the period 2T; however, as is the case with Embodiment 2 or 3, the respective reference voltages may be updated in a period longer than the period 2T when the motor controller is activated or while the motor is stopped.

Still moreover, in the reference-voltage learning processing described in Embodiments 2 through 4, a plurality of A/D-converted values may be utilized and stored as learning values.

As described above, a brushless motor rotation-position detection system, configured simply and inexpensively, according to the present invention makes it possible to accurately detect the rotation position of a brushless motor, even in the case where only a single A/D converter is provided in a microcomputer included in a motor controller and no sample/hold circuit is provided in a motor controller.

Various modifications and alterations of this invention will be apparent to those skilled in the art without departing from the scope and spirit of this invention, and it should be understood that this is not limited to the illustrative embodiments set forth herein.

What is claimed is:

1. A brushless motor rotation-position detection system comprising:
    a resolver mounted in a brushless motor;
    a motor controller for driving the brushless motor; and
    a microcomputer comprising calculation means that performs calculation for controlling the motor, based on rotation-position information on the brushless motor, wherein the calculation means includes:
        an excitation signal supply means that supplies an excitation signal to the resolver;
        an analogue/digital converter that alternately applies analogue/digital conversion to a sine wave signal and a cosine wave signal outputted from the resolver after an excitation signal is supplied to the resolver;
        a resolver amplitude calculation means that calculates a sine wave amplitude and a cosine wave amplitude, based on the sine wave signal and the cosine wave signal obtained through the analogue/digital conversion by the analogue/digital converter; and
        a motor angle calculation means that calculates a motor rotation angle of the brushless motor, based on the sine wave amplitude and the cosine wave amplitude calculated by the resolver amplitude calculation means, wherein the analogue/digital converter determines whether to convert the sine wave signal or the cosine wave signal based on a counter value stored in the microcomputer.

2. The brushless motor rotation-position detection system according to claim 1, wherein there is provided only a single analogue/digital converter.

3. The brushless motor rotation-position detection system according to claim 1, wherein the analogue/digital converter applies analogue/digital conversion to a sine wave signal at a first timing, the sine wave signal at a second timing, a cosine wave signal at a third timing, and the cosine wave signal at a fourth timing, wherein the first timing, the second timing, the third timing, and the fourth timing are consecutive points in time.

4. The brushless motor rotation-position detection system according to claim 1, wherein the analogue/digital converter applies analogue/digital conversion to a sine wave signal at a first timing, a cosine wave signal at a second timing, the sine wave signal at a third timing, and the cosine wave signal at a fourth timing, wherein the first timing, the second timing, the third timing, and the fourth timing are consecutive points in time.

5. The brushless motor rotation-position detection system according to claim 1, wherein respective reference voltages of a sine wave signal and a cosine wave signal outputted from the resolver are learned.

6. The brushless motor rotation-position detection system according to claim 5, wherein operation of the learning is performed when the motor controller is activated.

7. The brushless motor rotation-position detection system according to claim 5, wherein operation of the learning is performed while the motor is stopped.

8. The brushless motor rotation-position detection system according to claim 5, wherein operation of the learning is performed every specific time while the motor is driven.

9. The brushless motor rotation-position detection system according to claim 5, wherein, in the learning operation, the respective average values of a sine wave signal and a cosine wave signal outputted from the resolver are stored as learning values.

10. The brushless motor rotation-position detection system according to claim 5, wherein, in the learning operation, there are stored as learning values the respective voltages of a sine wave signal and a cosine wave signal outputted from the resolver when the excitation signal is stopped.

11. The brushless motor rotation-position detection system according to claim 1, wherein the counter value is incremented after each conversion by the analogue/digital converter until the counter value equal four and wherein if the counter value is equal to four, the counter is reset to one after the conversion by the analogue/digital converter.

12. The brushless motor rotation-position detection system according to claim 1, wherein timings for performing conversions of the sine wave signal and the cosine wave signal by the analogue/digital converter conforms to when the excitation signal is approximately a maximum value and approximately a minimum value.

13. The brushless motor rotation-position detection system according to claim 3, wherein a time interval between two consecutive timings is 50 μm.

14. The brushless motor rotation-position detection system according to claim 11, wherein the resolver amplitude calculation means calculates the sine wave amplitude and the cosine wave amplitude based on the sine wave signal and the cosine wave signal obtained during incrementing of the counter by the microprocessor from one to four and wherein the motor angle calculation means calculates the motor rotation angle according to the following equation:

$$\theta = \arctan(V\sin/V\cos),$$

wherein V sin is the sine wave amplitude output by the resolver amplitude calculation means and the V cos is the cosine wave amplitude output by the resolver amplitude calculation means.

* * * * *